United States Patent
Nakamura et al.

(10) Patent No.: US 10,938,375 B2
(45) Date of Patent: Mar. 2, 2021

(54) RESONATOR

(71) Applicant: Murata Manufacturing Co., Ltd., Nagaokakyo (JP)

(72) Inventors: Daisuke Nakamura, Nagaokakyo (JP); Toshio Nishimura, Nagaokakyo (JP); Ville Kaajakari, Altadena, CA (US)

(73) Assignee: MURATA MANUFACTURING CO, LTD., Nagaokakyo (JP)

( * ) Notice: Subject to any disclaimer, the term of this patent is extended or adjusted under 35 U.S.C. 154(b) by 789 days.

(21) Appl. No.: 15/690,482

(22) Filed: Aug. 30, 2017

(65) Prior Publication Data
US 2018/0054180 A1 Feb. 22, 2018

Related U.S. Application Data

(63) Continuation of application No. PCT/JP2016/060262, filed on Mar. 29, 2016.
(Continued)

(30) Foreign Application Priority Data

Mar. 31, 2015 (JP) .............................. JP2015-072882

(51) Int. Cl.
*H03H 9/10* (2006.01)
*H03H 9/05* (2006.01)
(Continued)

(52) U.S. Cl.
CPC ...... *H03H 9/0595* (2013.01); *H03H 9/02275* (2013.01); *H03H 9/1057* (2013.01);
(Continued)

(58) Field of Classification Search
CPC ............. H03H 9/0595; H03H 9/02275; H03H 9/1057; H03H 9/132; H03H 9/174
(Continued)

(56) References Cited

U.S. PATENT DOCUMENTS

| | | |
|---|---|---|
| 4,350,918 A | 9/1982 | Sato |
| 4,609,844 A | 9/1986 | Nakamura et al. |
| | (Continued) | |

FOREIGN PATENT DOCUMENTS

| | | |
|---|---|---|
| JP | S55-85119 A | 6/1980 |
| JP | H08-186467 A | 7/1996 |
| | (Continued) | |

OTHER PUBLICATIONS

International Search Report issued in International Application No. PCT/JP2016/060262, dated Jun. 21, 2016.
(Continued)

*Primary Examiner* — Derek J Rosenau
(74) *Attorney, Agent, or Firm* — Arent Fox LLP

(57) ABSTRACT

A resonator that includes a rectangular vibrating portion having first and second pairs of sides that provides contour vibration. A frame surrounds a periphery of the vibrating portion and a first holding unit between the frame and one of the first sides and includes a first arm substantially in parallel to the vibrating portion, multiple second arms connecting the first arm with the vibrating portion, and a third arm connecting the first arm with the frame. A first connection line is on the first arm; a first terminal is on the frame; three or more electrodes are on the vibrating portion; and multiple first extended lines are on the second arms and connect first and second electrodes with the first connection line. The first extended lines are connected to the first connection line, which is electrically connected to the first terminal.

20 Claims, 9 Drawing Sheets

Related U.S. Application Data

(60) Provisional application No. 62/221,331, filed on Sep. 21, 2015.

(51) Int. Cl.
- *H03H 9/17* (2006.01)
- *H03H 9/13* (2006.01)
- *H03H 9/02* (2006.01)
- *H03H 9/24* (2006.01)
- *H03H 9/15* (2006.01)

(52) U.S. Cl.
CPC ............ *H03H 9/132* (2013.01); *H03H 9/174* (2013.01); *H03H 9/2452* (2013.01); *H03H 2009/02503* (2013.01); *H03H 2009/155* (2013.01)

(58) Field of Classification Search
USPC .......................................... 310/348, 368, 370
See application file for complete search history.

(56) References Cited

U.S. PATENT DOCUMENTS

| | | | |
|---|---|---|---|
| 5,548,180 | A | 8/1996 | Kaida |
| 7,639,105 | B2 | 12/2009 | Ayazi et al. |
| 7,843,284 | B2 | 11/2010 | Ayazi et al. |
| 8,446,078 | B2 | 5/2013 | Gaidarzhy et al. |
| 2008/0079334 | A1* | 4/2008 | Yong ........................ H03H 9/08 310/361 |
| 2010/0314969 | A1* | 12/2010 | Gaidarzhy ......... H03H 9/02433 310/321 |
| 2011/0204999 | A1 | 8/2011 | Phan Le et al. |
| 2012/0068578 | A1 | 3/2012 | Takahashi |
| 2013/0285676 | A1 | 10/2013 | Rahafrooz et al. |
| 2016/0111627 | A1 | 4/2016 | Hase et al. |
| 2016/0322954 | A1 | 11/2016 | Kaida et al. |

FOREIGN PATENT DOCUMENTS

| | | |
|---|---|---|
| JP | 2003-198300 A | 7/2003 |
| JP | 2009-100196 A | 5/2009 |
| JP | 2010-232943 A | 10/2010 |
| JP | 2012-080166 A | 4/2012 |
| JP | 2012-151651 A | 8/2012 |
| JP | 2014-50067 A | 3/2014 |
| JP | 2014-068098 A | 4/2014 |
| WO | WO 2015/002261 A1 | 1/2015 |

OTHER PUBLICATIONS

International Search Report issued in International Application No. PCT/JP2016/060269, dated Jun. 21, 2016.

Written Opinion of the International Searching Authority issued in International Application No. PCT/JP2016/060262, dated Jun. 21, 2016.

Written Opinion of the International Searching Authority issued in International Patent Application No. PCT/JP2016/060269, dated Jun. 21, 2016.

International Search Report issued for PCT/JP2016/068476, dated Sep. 13, 2016.

Written Opinion of the International Searching Authority issued for PCT/JP2016/068476, dated Sep. 13, 2016.

\* cited by examiner

RESONATOR

CROSS REFERENCE TO RELATED APPLICATIONS

The present application is a continuation of PCT/JP2016/060262 filed Mar. 29, 2016, which claims priority to Japanese Patent Application No. 2015-072882, filed Mar. 31, 2015, and U.S. Patent Provisional No. 62/221,331, filed Sep. 21, 2015, the entire contents of each of which are incorporated herein by reference.

TECHNICAL FIELD

The present disclosure relates generally to a resonator.

BACKGROUND

Currently, piezoelectric resonator devices using MEMS (Micro Electro Mechanical Systems) technology are used, for example, as timing devices. These piezoelectric resonator devices are typically mounted on a printed circuit board built in an electronic apparatus such as a smartphone, for example.

Resonators used in such piezoelectric resonator devices include a resonator that provides high-order contour vibration in which electrodes with the same phase are connected with each other via an end electrode provided on a vibrating portion. Patent Document 1 (identified below) discloses a configuration of a resonator in which upper electrodes are connected by a busbar and then the electrodes are extended from a vibrating portion to a holder at the outer periphery thereof.

Patent Document 1: U.S. Pat. No. 7,843,284.

However, the conventional resonator described in Patent Document 1 may degrade its characteristics by the influence of parasitic capacitance generated between the end electrode and the upper electrode. Also, since the end electrode is required to be provided at an end portion of the vibrating portion, the upper electrode may not be arranged up to the end portion of the vibrating portion.

SUMMARY OF THE INVENTION

The present disclosure is provided to address the technical limitations of conventional technologies. Therefore, it is an object of the present disclosure to provide a resonator that can reduce the influence of parasitic resistance generated between a connection line that connects electrodes with each other and the electrodes.

A resonator according to an exemplary aspect includes a rectangular vibrating portion having first and second long sides and first and second short sides, and is configured to provide contour vibration. Moreover, the resonator includes a holder provided to surround a periphery of the vibrating portion, and holding the vibrating portion; a first holding unit provided between the holder and the first long side, including a first arm provided substantially in parallel to the vibrating portion, a plurality of second arms connecting the first arm with the vibrating portion, and a third arm connecting the first arm with the holder, and connecting the vibrating portion with the holder. In addition, a first connection line is provided on the first arm; a first terminal is provided at the holder; at least three electrodes are provided on the vibrating portion; and a plurality of first extended lines are provided on the plurality of second arms and connecting first and second electrodes included in the at least three electrodes with the first connection line. Moreover, the plurality of first extended lines are connected to the first connection line. The first connection line is electrically connected to the first terminal. The first and second electrodes receive an electric field with a same phase applied from the first terminal.

In an exemplary aspect, the first terminal may be provided at a position so as to face the first long side or may be extracted to a position so as to face the first short side at the holder.

Preferably, the resonator includes at least four electrodes. The resonator may further include a second holding unit provided between the holder and the second long side, including a first arm provided substantially in parallel to the vibrating portion, a plurality of second arms connecting the first arm with the vibrating portion, and a third arm connecting the first arm with the holder, and connecting the vibrating portion with the holder. In addition, a second connection line is provided on the first arm of the second holding unit; a second terminal is provided at the holder; and a plurality of second extended lines are provided on the plurality of second arms and connecting third and fourth electrodes included in the at least four electrodes with the second connection line. The plurality of second extended lines may be connected to the second connection line. The second connection line may be electrically connected to the second terminal. The third and fourth electrodes may receive an electric field with a phase different from the phase of the electric field applied to the first and second electrodes.

In one exemplary aspect, the second terminal may be provided at a position so as to face the second long side or may be extracted to a position so as to face the second short side at the holder.

With the resonator, the connection line that connects the electrodes, to which the electric field with the same phase is applied, with each other is provided outside the vibrating portion. Since the connection line is provided outside the vibrating portion, a constant gap can be provided between the connection line and particularly the electrode to which the electric field with the phase opposite to the phase of the electric field of the electrode connected by the connection line is applied. Hence, the influence of parasitic capacitance can be reduced. Accordingly, the vibration characteristics of the vibrating portion can be improved. Further, since a busbar is not required to be provided at the vibrating portion, an electrode can be arranged up to an end portion of the vibrating portion.

Preferably, in an exemplary aspect, two arms included in the plurality of second arms of the first holding unit may be provided so as to respectively correspond to the first and second electrodes. Two arms included in the plurality of second arms of the second holding unit may be provided so as to respectively correspond to the third and fourth electrodes.

With this mode, the pair of holding units included in the resonator has a symmetrical configuration in the vertical and horizontal directions. Accordingly, the symmetrical design can suppress vibration issues that may otherwise occur when a non-required vibration mode is coupled to high-order contour vibration.

A resonator according to another exemplary aspect includes a rectangular vibrating portion having a pair of first sides being opposite to each other and a pair of second sides being opposite to each other, and configured to provide contour vibration. Furthermore, a holder is provided to surround a periphery of the vibrating portion, and holding the vibrating portion; a first holding unit is provided between the holder and the first side, and having a plurality of arms connecting the vibrating portion with the holder; a first connection line is provided at the holder at a position so as to face at least one of the pair of first sides; a first terminal is provided at the holder; at least three electrodes are provided on the vibrating portion; and a plurality of first extended lines are provided on the plurality of arms of the first holding unit, and connecting first and second electrodes included in the at least three electrodes with the first connection line. In this aspect, the plurality of first extended lines are connected to the first connection line. The first connection line is electrically connected to the first terminal. The first and second electrodes receive an electric field with a same phase applied from the first terminal.

In an exemplary aspect, the first terminal may be provided at a position so as to face the first long side or may be extracted to a position so as to face the first short side at the holder.

Preferably, the resonator includes at least four electrodes. The resonator may further include a second holding unit provided between the holder and another one of the pair of first sides, and having a plurality of arms connecting the vibrating portion with the holder; a second connection line provided at the holder at a position so as to face the other side; a second terminal provided at the holder; and a plurality of second extended lines provided on the plurality of arms of the second holding unit, and connecting third and fourth electrodes included in the at least four electrodes with the second connection line. The plurality of second extended lines may be connected to the second connection line. Moreover, the second connection line may be electrically connected to the second terminal. The third and fourth electrodes may receive an electric field with a phase different from the phase of the electric field applied to the first and second electrodes.

In an exemplary aspect, the second terminal may be provided at a position so as to face the second long side or may be extracted to a position so as to face the second short side at the holder.

With the exemplary resonator, since the connection line is provided on the holder, the holding unit can be shortened. Hence, even when the width of the holding unit is decreased in order to decrease the loss of vibration, the resonant resistance of the holding unit can be decreased.

According to the exemplary resonators disclosed herein, the influence of parasitic capacitance experienced by conventional designs as described above can be reduced.

DETAILED DESCRIPTION OF EXEMPLARY EMBODIMENTS

First Embodiment

Figure 1:
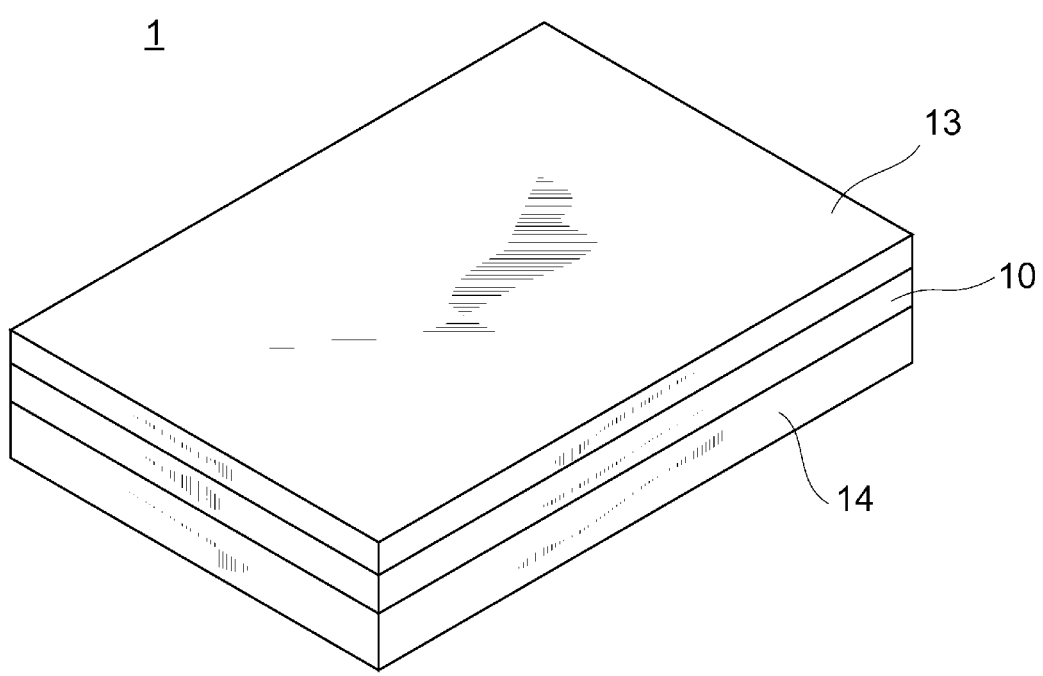
FIG. 1 is a perspective view schematically illustrating the external appearance of a resonator device according to a first embodiment.

A first exemplary embodiment is described below with reference to the accompanying drawings. FIG. 1 is a perspective view schematically illustrating the external appearance of a resonator device 1 according to the first exemplary embodiment. As shown, the resonator device 1 includes a lower substrate 14, an upper substrate 13 that forms a vibration space between the upper substrate 13 and the lower substrate 14, and a resonator 10 sandwiched and held between the lower substrate 14 and the upper substrate 13. The resonator 10 is a MEMS vibrator manufactured by using MEMS technology.

Figure 2:
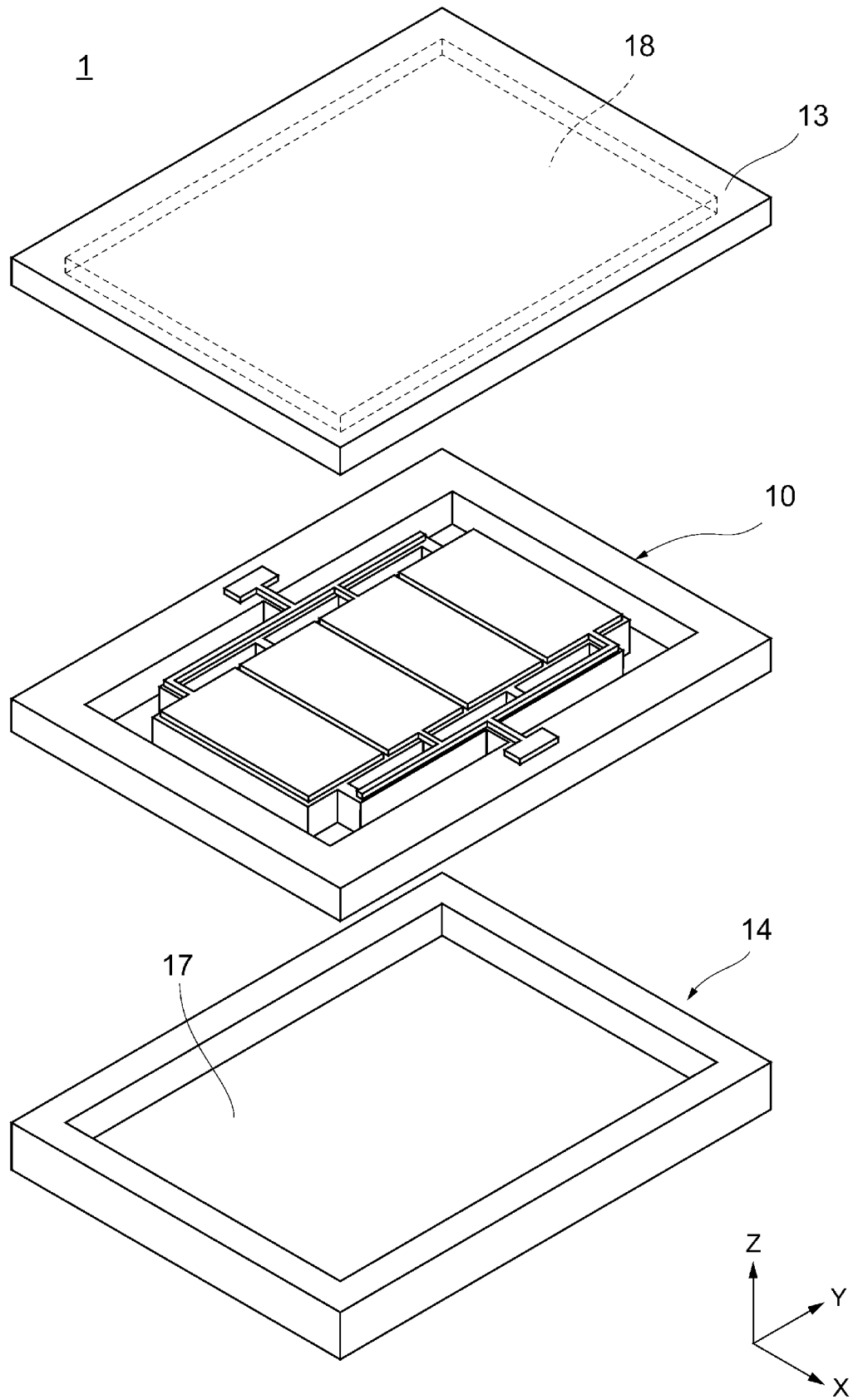
FIG. 2 is an exploded perspective view schematically illustrating the structure of the resonator device according to the first embodiment.

FIG. 2 is an exploded perspective view schematically illustrating the structure of the resonator device 1 according to the first exemplary embodiment. The lower substrate 14 extends in a flat-plate shape along the XY plane. A recess 17 having, for example, a flat rectangular-parallelepiped shape is formed in the upper surface of the lower substrate 14. The recess 17 forms a portion of the vibration space of the resonator 10. The upper substrate 13 extends in a flat-plate shape along the XY plane. A recess 18 having, for example, a flat rectangular-parallelepiped shape is formed in the lower surface of the upper substrate 13. The recess 18 forms a portion of the vibration space of the resonator 10. This vibration space is maintained in a vacuum. The lower substrate 14 and the upper substrate 13 are formed of, for example, Si (silicon).

Figure 3:
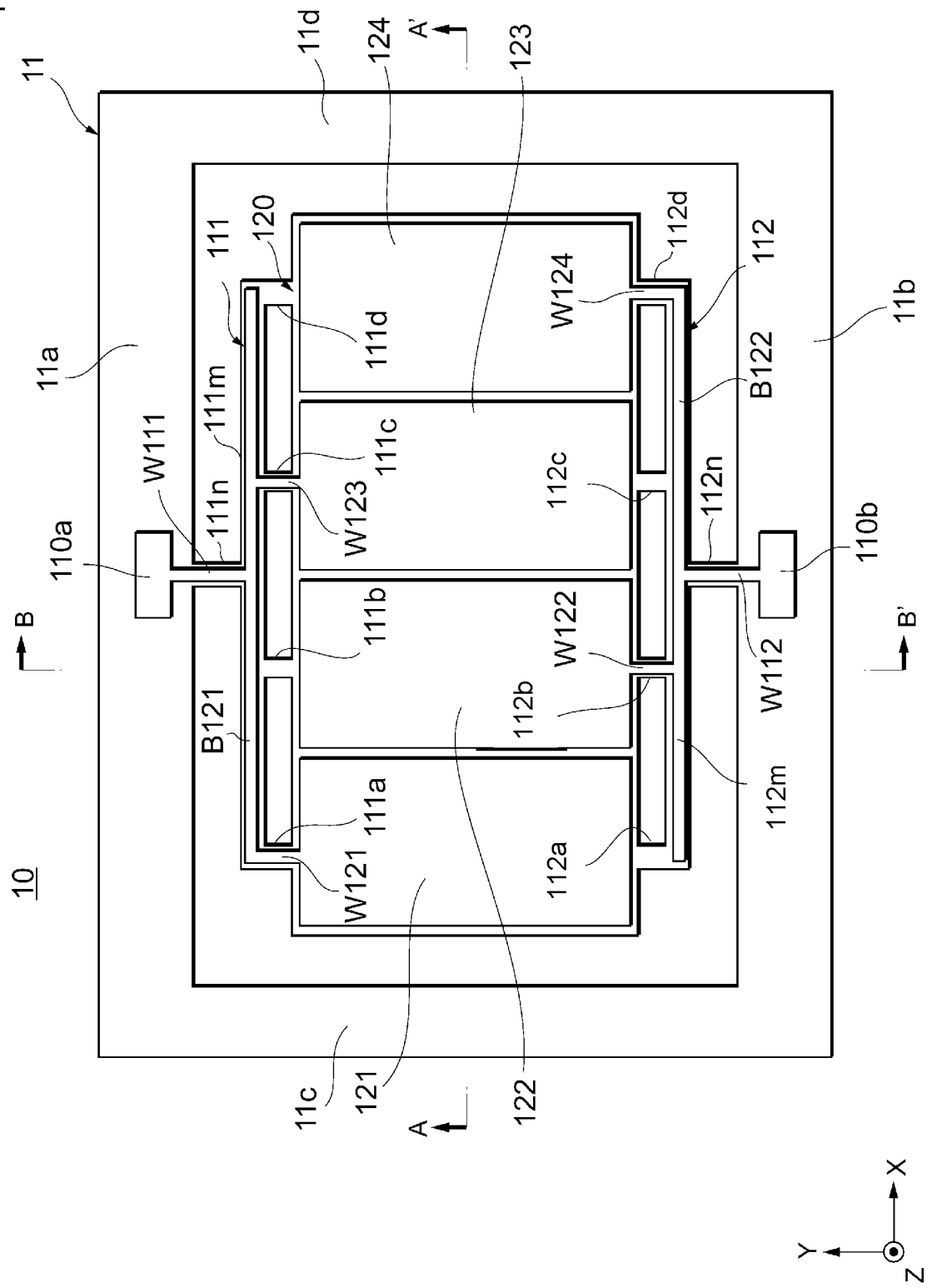
FIG. 3 is a plan view schematically illustrating an example structure of a resonator according to the first embodiment.

FIG. 3 is a plan view schematically illustrating the structure of the resonator 10 according to this embodiment. Components of the resonator 10 according to this embodiment are described with reference to FIG. 3. The resonator 10 includes a vibrating portion 120, a holder or frame 11, a holding unit 111 (an example of a first holding unit), a holding unit 112 (an example of a second holding unit), a connection line B121 (an example of a first connection line), a connection line B122 (an example of a second connection line), and extended lines W111, W121 (an example of a first extended line), W123 (an example of a first extended line), W112, W122 (an example of a second extended line), and W124 (an example of a second extended line).

Vibrating Portion 120

In an exemplary aspect, the vibrating portion 120 has a substantially rectangular-parallelepiped contour extending in a flat-plate shape along the XY plane according to the orthogonal coordinate system in FIG. 3. It is noted that the term "substantially" is used herein to take into account minor fluctuations in the shape and dimensions of the features of the exemplary resonator described herein that may result from variations that occur during the manufacturing process, for example.

According to an exemplary aspect, four rectangular-plate-shaped upper electrodes 121 to 124 (examples of first to fourth electrodes) each having a length direction and a width direction are provided on the vibrating portion 120. In FIG. 3, the vibrating portion 120 has long sides in the X-axis direction and short sides in the Y-axis direction. The four upper electrodes 121 to 124 have long sides in the Y-axis direction and short sides in the X-axis direction.

According to the exemplary aspect, a space (i.e., a hole) is defined between the vibrating portion 120 and the frame or holder 11 by a predetermined distance. In the example in FIG. 3, the vibrating portion 120 is connected to and held by the holder 11 by using the holding units 111 and 112 (described later) at a pair of long sides of the vibrating portion 120. Thus, one or a plurality of holes or spaces can be defined in the holding units 111 and 112 as described herein. It should also be appreciated that the vibrating portion 120 is not held by the holder 11 at a pair of short sides of the vibrating portion 120 according to the exemplary aspect.

Stack Structure

Figure 4:
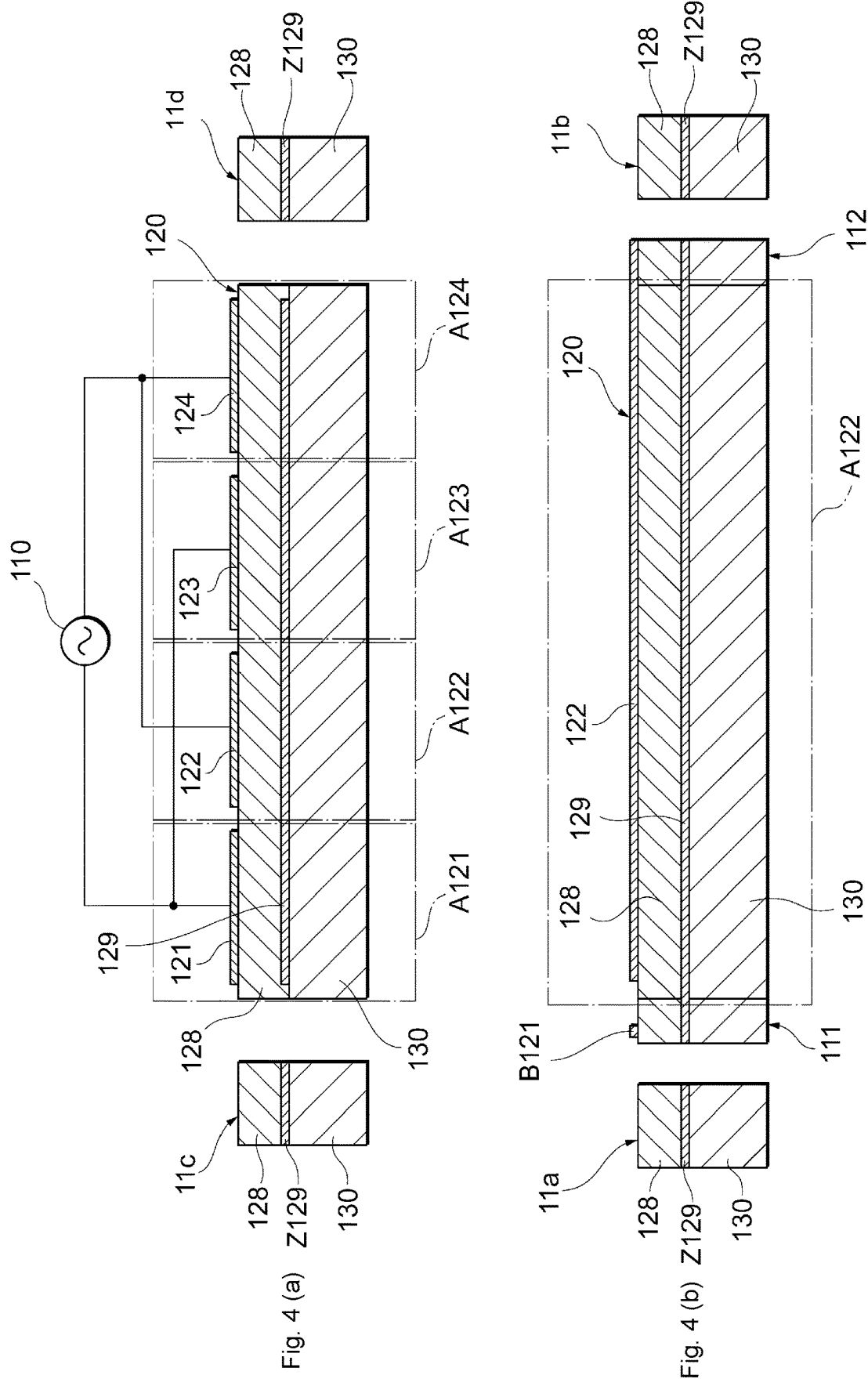
FIGS. 4(a) and 4(b) schematically illustrate exemplary structures in a cross section of the resonator according to the first embodiment.

The stack structure of the vibrating portion 120 is described with reference to FIG. 4(A). FIG. 4(A) is a cross-sectional view taken along line A-A' in FIG. 3.

As illustrated in FIG. 4(A), in the vibrating portion 120, a lower electrode 129 is stacked on a Si substrate 130 made of a degenerate semiconductor. The Si substrate 130 may desirably have, for example, a length of about 140 µm, a width of about 400 µm, and a thickness of about 10 µm. The lower electrode 129 is formed of metal, for example, molybdenum (Mo) or aluminum (Al), and has a thickness of about 0.1 µm. Alternatively, the Si substrate 130 being a degenerate semiconductor may be used as a lower electrode without formation of the metal lower electrode 129.

Moreover, a piezoelectric thin film 128 is stacked on the lower electrode 129 so as to cover the lower electrode 129. Further, the upper electrodes 121 to 124 can be formed simultaneously, for example, are can be stacked on the piezoelectric thin film 128. The upper electrodes 121 to 124 is formed on the vibrating portion 120, and then is divided into four by processing such as etching.

The piezoelectric thin film 128 is a thin film of a piezoelectric body that transforms an applied voltage into a vibration. For example, the main component of the piezoelectric body may be a nitride such as aluminum nitride, or an oxide. To be specific, the piezoelectric thin film 128 may be formed of scandium aluminum nitride (ScAlN). ScAlN is obtained by replacing part of aluminum (Al) in aluminum nitride (AlN) with scandium (Sc). Also, the piezoelectric thin film 128 has, for example, a thickness of 0.8 µm.

Also, the upper electrodes 121 to 124 are formed of metal, for example, molybdenum (Mo) or aluminum (Al), and each have a thickness of about 0.1 µm similarly to the lower electrode 129.

Next, a function of the vibrating portion 120 is described according to an exemplary aspect. The vibrating portion 120 provides contour vibration in the X-axis direction when an alternating electric field is applied to the vibrating portion 120.

For example, in the exemplary embodiment, the piezoelectric thin film 128 is oriented in a c-axis direction, i.e., the piezoelectric layer can have a crystallographic axis that extends at an angle relative to the vertical axis of the resonator. When a predetermined electric field is applied to the upper electrodes 121 to 124 to form a predetermined electric potential difference between the lower electrode 129 and the upper electrodes 121 to 124, the piezoelectric thin film 128 expands and contracts in the XY plane direction in accordance with the electric potential difference. Thus the vibrating portion 120 provides contour vibration. In one exemplary aspect, the lower electrode 129 is not electrically connected to either the first terminal 110a or the second terminal 110b. In another aspect, the lower electrode 129 is a float electrode, for example.

As illustrated in FIG. 4(A), the vibrating portion 120 is divided into vibration regions A121 to A124 corresponding to the upper electrodes 121 to 124. That is, the upper electrodes 121 to 124 are respectively formed in the vibration regions A121 to A124. When an alternating electric field is applied in the c-axis direction of the piezoelectric thin film 128 so that neighboring electrodes have opposite phases in the upper electrodes 121 to 124, neighboring ones of the vibration regions A121 to A124 are mechanically coupled to one another. Accordingly, a position around the center in the X-axis direction of each region serves as a node of vibration. The four vibration regions A121 to A124 vibrate in the in-plane direction because the neighboring regions have the opposite phases. Thus the vibrating portion 120 provides high-order contour vibration as a whole.

The Si substrate 130, the lower electrode 129, and the piezoelectric thin film 128 are shared by the vibration regions A121 to A124.

Referring back to FIG. 3, other components of the resonator 10 are described.

2-1. Exemplary Configuration of Frame 11

The frame or holder 11 is formed in a rectangular frame shape along the XY plane according to the exemplary embodiment. The holder 11 is only required to be provided at least at a portion of the periphery of the vibrating portion 120. The shape of the holder 11 is not limited to the frame shape. The holder 11 is provided to surround the vibrating portion 120 and the outer side portion of the vibrating portion 120 along the XY plane. To be more specific, the holder 11 includes a pair of long-side plate-shaped frame bodies 11a and 11b extending in parallel to the X-axis direction so as to face the long sides of the vibrating portion 120, and a pair of short-side frame bodies 11c and 11d extending in parallel to the Y-axis direction so as to face the short sides of the vibrating portion 120. Both ends of the frame bodies 11c and 11d are respectively connected to both ends of the frame bodies 11a and 11b.

Voltage applying portions 110a (an example of a first terminal) and 110b (an example of a second terminal) are respectively formed on the frame bodies 11a and 11b. The voltage applying portions 110a and 110b can apply alternating electric fields to the upper electrodes 121 to 124 via the holding units 111 and 112. In this embodiment, the voltage applying portion 110a is formed around the center of the frame body 11a, and the voltage applying portion 110b is formed around the center of the frame body 11b. In addition, voltage applying portions may be formed at the frame bodies 11c and 11d.

In the following description, the frame body 11a side is referred to as the upper side of the resonator 10, and the frame body 11b side is referred to as the lower side of the resonator 10.

2-2. Stack Structure

As illustrated in FIG. 4(A), in the holder 11, a metal layer 2129, which is integrally formed with the lower electrode 129 of the vibrating portion 120 by the same process, is formed on the Si substrate 130 made of a degenerate semiconductor, and the piezoelectric thin film 128 is stacked on the metal layer 2129 to cover the metal layer 2129. The holder 11 is integrally formed with the vibrating portion 120, in the order of the Si substrate 130, the metal layer 2129, and the piezoelectric thin film 128. Then the holder 11 is removed by processing such as etching so as to have a desirable shape. Alternatively, the metal layer 2129 provided in the holder 11 may be removed when the lower electrode 129 is formed into a predetermined shape by etching etc.

3-1. Exemplary Configuration of Holding Unit 111

The holding unit 111 connects the vibrating portion 120 with the holder 11. The holding unit 111 is provided inside the holder 11 along the XY plane, and is provided between a long side of the vibrating portion 120 and the frame body 11a. The holding unit 111 includes a main arm 111n (an example of a third arm of a first holding unit), a support arm 111m (an example of a first arm of the first holding unit), and child arms 111a to 111d (examples of a plurality of second arms of the first holding unit).

The support arm 111m is provided in a space between the vibrating portion 120 and the frame body 11a, and extends in parallel to the X-axis direction over the upper electrodes 121 to 124, so as to face the long side of the vibrating portion 120.

The main arm 111n is provided in parallel to the Y-axis direction so as to face the long side of the vibrating portion 120, and connects the support arm 111m with the frame body 11a.

The child arms 111a to 111d are provided in the space between the vibrating portion 120 and the frame body 11a, and extend in parallel to the Y-axis direction, so as to face the long side of the vibrating portion 120. A lower end of the child arm 111a is connected to the long side of the vibrating portion 120 at a position around the center of an upper short side of the upper electrode 121. An upper end of the child arm 111a is connected to a first end portion of the support arm 111m. A lower end of the child arm 111d is connected to the long side of the vibrating portion 120 at a position around the center of an upper short side of the upper electrode 124. An upper end of the child arm 111d is connected to a second end portion of the support arm 111m. A lower end of the child arm 111b is connected to the long side of the vibrating portion 120 at a position around the center of an upper short side of the upper electrode 122. An upper end of the child arm 111b is connected to the support arm 111m. A lower end of the child arm 111c is connected to the long side of the vibrating portion 120 at a position around the center of an upper short side of the upper electrode 123. An upper end of the child arm 111c is connected to the support arm 111m.

The support arm 111m, the main arm 111n, and the child arms 111a to 111d are rectangular plates with long sides each being about 5 μm. In this embodiment, the holding unit 111 has the same number of child arms as the number of electrodes of the vibrating portion 120. The holding unit 111 has a left-right symmetrical configuration about the main arm 111n in the X-axis direction. Accordingly, the symmetrical design can suppress vibration issue that may otherwise occur when a non-required vibration mode is coupled to high-order contour vibration.

3-2. Exemplary Configuration of Holding Unit 112

The holding unit 112 connects the vibrating portion 120 with the holder 11. The holding unit 112 is provided between a long side of the vibrating portion 120 and the frame body 11b. The holding unit 112 includes a main arm 112n (an example of a third arm of a second holding unit), a support arm 112m (an example of a first arm of the second holding unit), and child arms 112a to 112d (examples of a plurality of second arms of the second holding unit).

The support arm 112m is provided in a space between the vibrating portion 120 and the frame body 11b, and extends in parallel to the X-axis direction over the upper electrodes 121 to 124, so as to face the long side of the vibrating portion 120.

As shown, the main arm 112n extends in a direction parallel to the Y-axis direction, and connects the support arm 112m with the frame body 11b according to the exemplary embodiment.

The child arms 112a to 112d are provided in the space between the vibrating portion 120 and the frame body 11b, and extend in parallel to the Y-axis direction, so as to face the long side of the vibrating portion 120. An upper end of the child arm 112a is connected to the long side of the vibrating portion 120 at a position around the center of a lower short side of the upper electrode 121. A lower end of the child arm 112a is connected to a first end portion of the support arm 112m. An upper end of the child arm 112d is connected to the long side of the vibrating portion 120 at a position around the center of a lower short side of the upper electrode 124. A lower end of the child arm 112d is connected to a second end portion of the support arm 112m. An upper end of the child arm 112b is connected to the long side of the vibrating portion 120 at a position around the center of a lower short side of the upper electrode 122. A lower end of the child arm 112b is connected to the support arm 112m. An upper end of the child arm 112c is connected to the long side of the vibrating portion 120 at a position around the center of a lower short side of the upper electrode 123. A lower end of the child arm 112c is connected to the support arm 112m.

The support arm 112m, the main arm 112n, and the child arms 112a to 112d are rectangular plates with long sides each being about 5 μm. In this embodiment, the holding unit 112 has the same number of child arms as the number of electrodes of the vibrating portion 120. The holding unit 112 has a left-right symmetrical configuration about the main arm 112n in the X-axis direction. Accordingly, the symmetrical configuration can suppress vibration issues that may otherwise be generated when a non-required vibration mode is coupled to high-order contour vibration.

Further, the above-described holding unit 111 and holding unit 112 have mutually symmetrical structures. Accordingly, the interruption of vibration can be further reliably suppressed.

3-3. Stack Structure

The stack structures of the holding units 111 and 112 are described with reference to FIG. 4(B). FIG. 4(B) is a cross-sectional view taken along line B-B' in FIG. 3.

As illustrated in FIG. 4(B), in the holding units 111 and 112, the metal layer 2129 is stacked on the Si substrate 130 made of a degenerate semiconductor, and the piezoelectric thin film 128 is stacked on the metal layer Z129 so as to cover the metal layer 2129. Moreover, the connection lines B121 and B122, and the extended lines W111, W121, W123, W112, W122, and W124 (described later) integrally formed with the upper electrodes 121 to 124 of the vibrating portion 120 by the same process are stacked on the piezoelectric thin film 128. The Si substrate 130, the metal layer 2129, the piezoelectric thin film 128, the connection lines B121 and B122, and the extended lines W111, W121, W123, W112, W122, and W124 of the holding units 111 and 112 are integrally formed with the vibrating portion 120, and are removed by processing such as etching so as to have a desirable shape. The metal layer 2129 provided in the holding units 111 and 112 may be removed when the lower electrode 129 is formed into a predetermined shape by etching etc.

Connection Line B121

The connection line B121 is provided in the space between the long side of the vibrating portion 120 and the frame body 11a. The connection line B121 is provided on the surface of the support arm 111m, and extends in parallel to the X-axis direction over the upper electrodes 121 to 124 so as to face the long side of the vibrating portion 120.

The connection line B121 connects the upper electrodes 121 and 123 with each other from among the four upper electrodes 121 to 124 provided on the vibrating portion 120. The upper electrodes 121 and 123 have the electric field with the same phase and are extended by the extended lines W121 and W123.

In this way, the resonator 10 according to this embodiment has the configuration in which the connection line B121 that connects the upper electrodes 121 and 123 having the same phase and provided on the vibrating portion 120 with each other is provided outside the vibrating portion 120. A gap is generated between the connection line B121 and the upper electrode 122 and hence the influence of parasitic capacitance can be reduced. Also, since a busbar is no longer required on the vibrating portion 120, the upper electrode 122 can be provided up to an end portion of the vibrating portion 120.

Further, since the connection line B121 is provided on the holding unit 111, the number of main arms serving as connection points between the holding unit 111 and the holder 11 can be decreased, and attenuation of vibration of the vibrating portion 120 can be reduced.

Extended Lines W111, W121, and W123

The extended lines W111, W121, and W123 are provided in the space between the long side of the vibrating portion 120 and the frame body 11a, and extend in parallel to the Y-axis direction.

The extended line W121 is provided on the surface of the child arm 111a, extends the upper electrode 121 onto the child arm 111a, and connects the upper electrode 121 with the connection line B121. The extended line W123 is provided on the surface of the child arm 111c, extends the upper electrode 123, to which an electric field with the same phase as that of the upper electrode 121 is applied, onto the child arm 111c, and connects the upper electrode 123 with the connection line B121.

The extended line W111 is provided on the main arm 111n, and connects the voltage applying portion 110a with the connection line B121.

Connection Line B122

The connection line B122 is provided in the space between the long side of the vibrating portion 120 and the frame body 11b. The connection line B122 is provided on the surface of the support arm 112m, and extends in parallel to the X-axis direction over the upper electrodes 121 to 124 so as to face the long side of the vibrating portion 120.

The connection line B122 connects the upper electrodes 122 and 124 with each other from among the four upper electrodes 121 to 124 provided on the vibrating portion 120. The upper electrodes 122 and 124 have the electric field with the same phase and are extended by the extended lines W122 and W124.

In this way, the resonator 10 according to this embodiment has the configuration in which the connection line B122 that connects the upper electrodes having the same phase and provided on the vibrating portion 120 with each other is provided outside the vibrating portion 120. A gap is generated between the connection line B122 and the upper electrode 123 and hence the influence of parasitic capacitance can be reduced. Also, since a busbar is no longer required on the vibrating portion 120, the upper electrode 123 can be provided up to an end portion of the vibrating portion 120.

Further, since the connection line B122 is provided on the holding unit 112, the number of main arms serving as connection points between the holding unit 112 and the holder 11 can be decreased, and attenuation of vibration of the vibrating portion 120 can be reduced.

Extended Lines W112, W122, and W124

The extended lines W112, W122, and W124 are provided in the space between the long side of the vibrating portion 120 and the frame body 11b, and extend in parallel to the Y-axis direction.

The extended line W122 is provided on the surface of the child arm 112b, extends the upper electrode 122 onto the child arm 112b, and connects the upper electrode 122 with the connection line B122. The extended line W124 is provided on the surface of the child arm 112d, extends the upper electrode 124, to which an electric field with the same phase as that of the upper electrode 122 is applied, onto the child arm 112d, and connects the upper electrode 124 with the connection line B122.

The extended line W112 is provided on the surface of the main arm 112n, and connects the voltage applying portion 110b with the connection line B122.

Second Embodiment

When a second embodiment and later embodiments are described, the description on the matters common to the first embodiment is omitted, and only different points are described. In particular, similar advantageous effects obtained by similar configurations are not repeated in respective embodiments.

Figure 5:
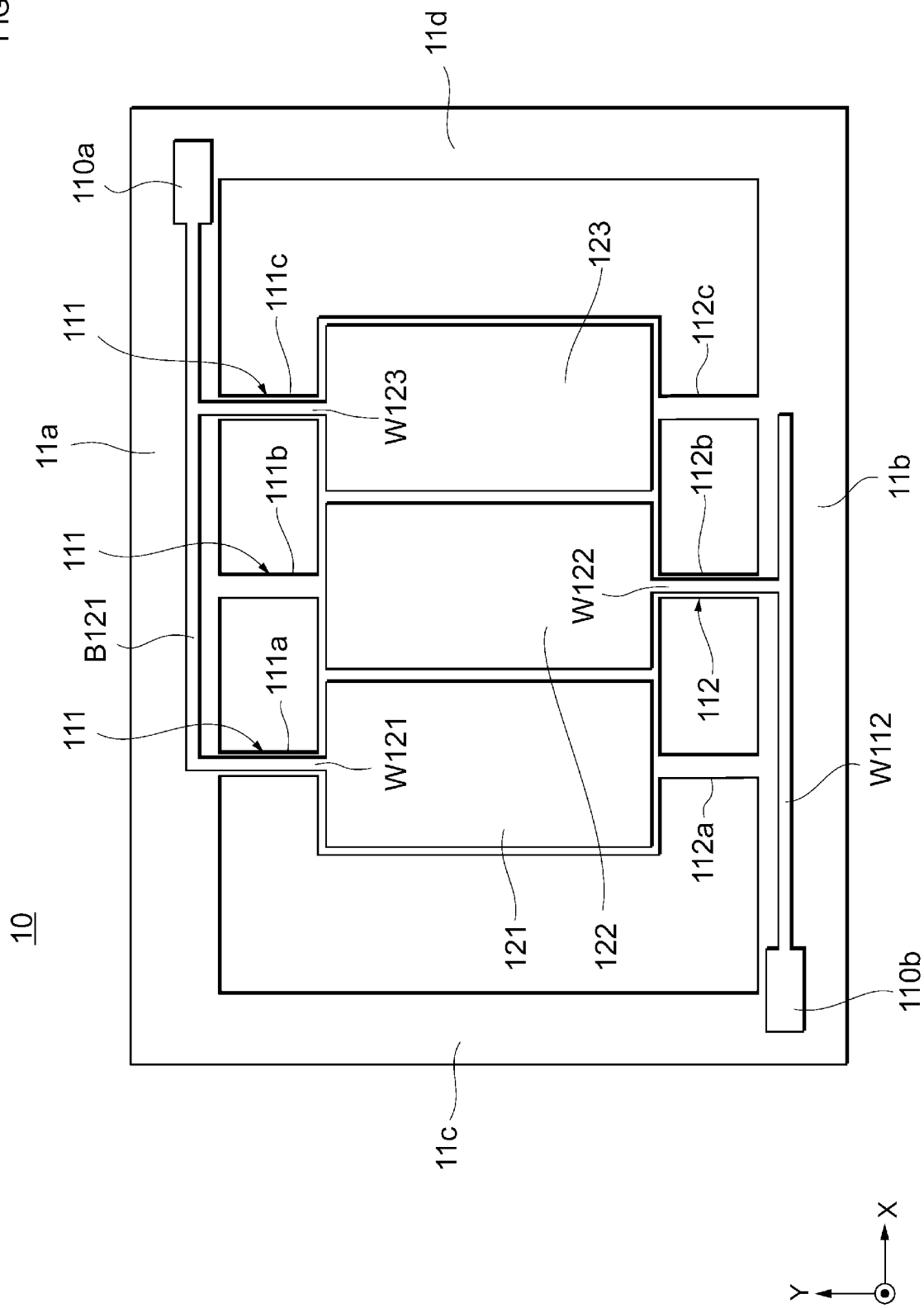
FIG. 5 is a plan view schematically illustrating an example structure of a resonator according to a second embodiment.

FIG. 5 is a plan view schematically illustrating an example structure of a resonator 10 according to this embodiment. The points different from the first embodiment are mainly described below from among specific components of the resonator 10 according to this embodiment.

Vibrating Portion 120

In this embodiment, a vibrating portion 120 includes three upper electrodes 121 to 123. The other configuration of the vibrating portion 120 is similar to that according to the first embodiment.

Holder 11

In this embodiment, voltage applying portions 110a and 110b are respectively provided on end portions of frame bodies 11a and 11b. The other configuration of the holder 11 is similar to that according to the first embodiment.

Holding Unit 111

In this embodiment, a holding unit 111 includes only three arms of child arms 111a to 111c, and does not have configurations corresponding to the support arm 111m and the main arm 111n. The other configuration of the holding unit 111 is similar to that according to the first embodiment.

Holding Unit 112

In this embodiment, a holding unit 112 includes only three arms of the child arms 112a to 112c, and does not have configurations corresponding to the support arm 112m and the main arm 112n. The other configuration of the holding unit 112 is similar to that according to the first embodiment.

Connection Line B121

In this embodiment, a connection line B121 is provided on the frame body 11a in parallel to the X-axis direction so as to face the long side of the vibrating portion 120. The connection line B121 connects the upper electrodes 121 and 123 extended by extended lines W121 and W123 with each other, and is connected to the voltage applying portion 110*a* provided on the end portion of the frame body 11*a*. In the resonator 10 according to this embodiment, since the connection line B121 is provided on the frame body 11*a* in this way, the holding unit 111 can be shortened. Hence, even when the width of the holding unit 111 is decreased in order to decrease the loss of vibration, the resonant resistance of the holding unit 111 can be decreased.

The other configuration of the connection line B121 is similar to that according to the first embodiment.

Extended Lines W111, W121, and W123

In this embodiment, the resonator 10 does not include the extended line W111. The configurations of the extended lines W121 and W123 are similar to those of the first embodiment.

Connection Line B122

In this embodiment, the resonator 10 does not include the connection line B122.

Extended Lines W112, W122, and W124

In this embodiment, the resonator 10 does not include the extended line W124. Also, an extended line W112 is provided on the frame body 11*b* in parallel to the X-axis direction so as to face the long side of the vibrating portion 120. The extended line W112 connects the upper electrode 122 extended by an extended line W122 with the voltage applying portion 110*b*. The configuration of the extended line W122 is similar to that of the first embodiment.

The other configuration and effect are similar to those according to the first embodiment.

Third Embodiment

Figure 6:
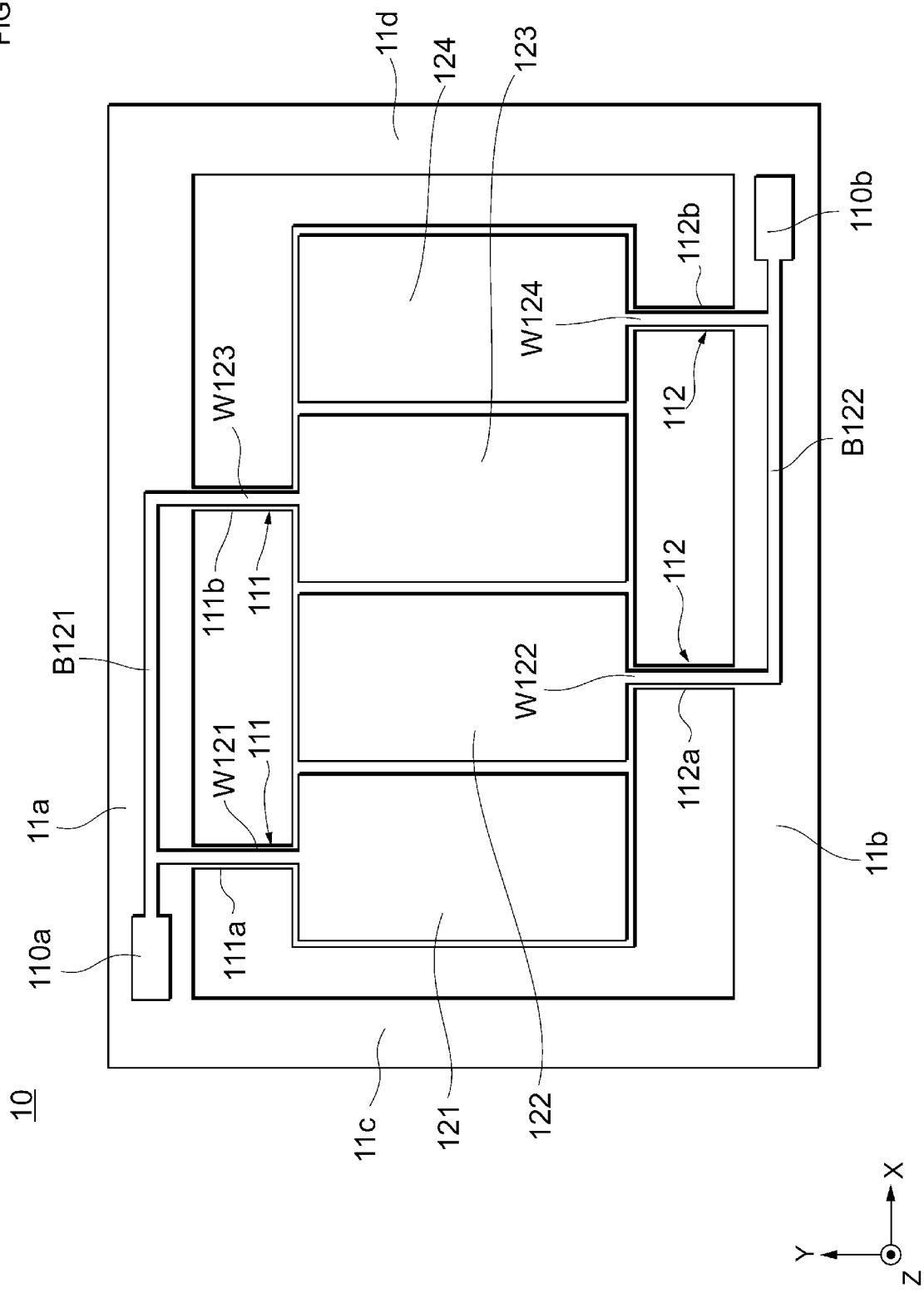
FIG. 6 is a plan view schematically illustrating an example structure of a resonator according to a third embodiment.

FIG. 6 is a plan view schematically illustrating an example structure of a resonator 10 according to this embodiment. The points different from the first embodiment are described below from among components of the resonator 10 according to this embodiment.

Vibrating Portion 120

The configuration of the vibrating portion 120 is similar to that according to the first embodiment.

Holder 11

In this embodiment, voltage applying portions 110*a* and 110*b* are respectively provided on end portions of frame bodies 11*a* and 11*b*. The other configuration of the holder 11 is similar to that according to the first embodiment.

Holding Unit 111

In this embodiment, a holding unit 111 includes only two arms of child arms 111*a* and 111*b*. Moreover, the number of electrodes provided on the vibrating portion 120 is not equal to the number of child arms. The holding unit 111 does not have configurations corresponding to the support arm 111*m* and the main arm 111*n*. In this embodiment, the holding unit 111 has a smaller number of child arms than the number of electrodes provided on the vibrating portion 120. Accordingly, since the number of child arms to be connected to the vibrating portion 120 is small, the loss of vibration energy leaking from arms can be decreased, and vibration characteristics are improved. Since the child arms on the outside of the long side of the vibrating portion 120 are partly omitted from the child arms of the holding unit 111, the effect of decreasing the energy loss can be improved.

The other configuration of the holding unit 111 is similar to that according to the first embodiment.

Holding Unit 112

In this embodiment, a holding unit 112 includes only two arms of child arms 112*a* and 112*b*. Moreover, the number of electrodes provided on the vibrating portion 120 is no equal to the number of child arms. The holding unit 112 does not have configurations corresponding to the support arm 112*m* and the main arm 112*n*. In this embodiment, the holding unit 112 has a smaller number of child arms than the number of electrodes provided on the vibrating portion 120. Accordingly, since the number of child arms to be connected to the vibrating portion 120 is small, the loss of vibration energy leaking from arms can be decreased, and vibration characteristics are improved. Since the child arms on the outside of the long side of the vibrating portion 120 are partly omitted from the child arms of the holding unit 112, the effect of decreasing the energy loss can be improved.

The other configuration of the holding unit 112 is similar to that according to the first embodiment.

Connection Line B121

In this embodiment, a connection line B121 is provided on the frame body 11*a* in a direction parallel to the X-axis direction so as to face the long side of the vibrating portion 120. The connection line B121 connects the upper electrodes 121 and 123 extended by extended lines W121 and W123 with each other, and is connected to the voltage applying portion 110*a* provided on the end portion of the frame body 11*a*. The other configuration of the connection line B121 is similar to that according to the first embodiment.

Extended Lines W121 and W123

In this embodiment, the resonator 10 does not include the extended line W111. The configurations of the extended lines W121 and W123 are similar to those of the first embodiment.

Connection Line B122

In this embodiment, a connection line B122 is provided on the frame body 11*b* in a direction parallel to the X-axis direction so as to face the long side of the vibrating portion 120. The connection line B122 connects the upper electrodes 122 and 124 extended by extended lines W122 and W124 with each other, and is connected to the voltage applying portion 110*b* provided on the end portion of the frame body 11*b*. The other configuration of the connection line B122 is similar to that according to the first embodiment.

Extended Lines W122 and W124

In this embodiment, the resonator 10 does not include the extended line W112. The configurations of the extended lines W122 and W124 are similar to those of the first embodiment.

The other configuration and effect are similar to those according to the first embodiment.

Fourth Embodiment

Figure 7:
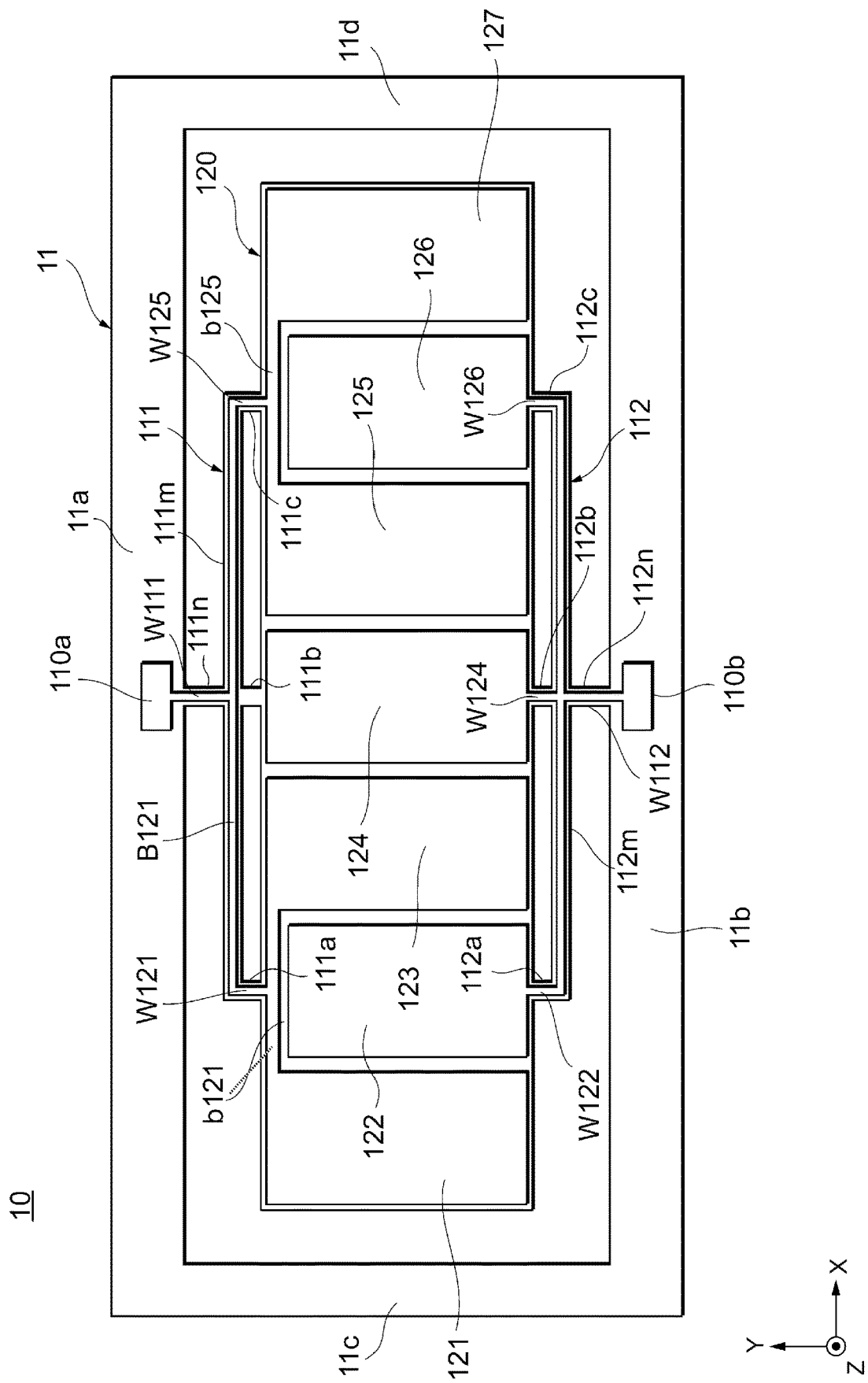
FIG. 7 is a plan view schematically illustrating an example structure of a resonator according to a fourth embodiment.

FIG. 7 is a plan view schematically illustrating an example structure of a resonator 10 according to this embodiment. The points different from the first embodiment are described below from among components of the resonator 10 according to this embodiment.

Vibrating Portion 120

In this embodiment, a vibrating portion 120 includes seven upper electrodes 121 to 127, and busbars b121 and b125. The busbar b121 is provided above the upper electrode 122 at an upper end portion of the vibrating portion 120, and extends in the X-axis direction in parallel to the long side of the vibrating portion 120. The busbar b125 is provided above the upper electrode 126 at an upper end portion of the vibrating portion 120, and extends in the X-axis direction in parallel to the long side of the vibrating portion 120.

From among the seven upper electrodes 121 to 127, the upper electrodes 121 and 123 to which an electric field with the same phase is applied are connected with each other by the busbar b121, and the upper electrodes 125 and 127 are connected with each other by the busbar b125 on the vibrating portion 120.

The vibrating portion 120 according to this embodiment includes the busbars b121 and b125 as described above. Accordingly, the number of connection points between the vibrating portion 120 and the holding unit 111 can be decreased, and the loss of vibration energy of the vibrating portion 120 can be decreased. On the other hand, since a busbar is not provided on the vibrating portion 120 at the center of the vibrating portion 120, the parasitic capacitance can be decreased and the upper electrodes can be arranged up to the end portions. Thus, efficient vibration with a large capacitance and a small resonant resistance can be obtained.

The other configuration of the vibrating portion 120 is similar to that according to the first embodiment.

Holder 11

The configuration of a holder 11 is similar to that according to the first embodiment.

Holding Unit 111

A holding unit 111 according to this embodiment includes child arms 111a, 111b, and 111c, a support arm 111m, and a main arm 111n. In this embodiment, the number of child arms of the holding unit 111 is not equal to the number of electrodes provided on the vibrating portion 120.

The holding unit 111 according to this embodiment does not have a child arm that is connected to a vibration region at the end-most position or a position around the endmost position of the vibrating portion 120. That is, the holding unit 111 has only child arms connected to a vibration region at the center or around the center of the vibrating portion 120. Accordingly, the loss of vibration energy can be decreased.

The other configuration of the holding unit 111 is similar to that according to the first embodiment.

Holding Unit 112

A holding unit 112 according to this embodiment includes child arms 112a, 112b, and 112c, a support arm 112m, and a main arm 112n. In this embodiment, the number of child arms of the holding unit 112 is not equal to the number of electrodes provided on the vibrating portion 120.

The holding unit 112 according to this embodiment does not have a child arm that is connected to a vibration region at the end-most position or a position around the endmost position of the vibrating portion 120. That is, the holding unit 112 has only child arms connected to a vibration region at the center or around the center of the vibrating portion 120. Accordingly, the loss of vibration energy can be decreased.

The other configuration of the holding unit 112 is similar to that according to the first embodiment.

Connection Line B121

The configuration of a connection line B121 according to this embodiment is similar to that according to the first embodiment.

Extended Lines W111, W121, and W125

In this embodiment, extended lines W121 and W125 are provided between the long side of the vibrating portion 120 and the frame body 11a in a direction parallel to the Y-axis direction. The extended line W121 is provided on the child arm 111a, and provides connection between the busbar b121, which connects the upper electrodes 121 and 123 with the same phase with each other, and the connection line B121.

The extended line W125 is provided on the child arm 111c, and provides connection between the busbar b125, which connects the upper electrodes 125 and 127 with the same phase with each other, and the connection line B121.

The configuration of an extended line W111 is similar to that of the first embodiment.

Connection Line B122

The configuration of a connection line B122 according to this embodiment is similar to that according to the first embodiment.

Extended Lines W112, W122, W124, and W126

In this embodiment, extended lines W122, W124, and W126 are provided between the long side of the vibrating portion 120 and the frame body 11b in a direction parallel to the Y-axis direction. The extended line W122 is provided on the child arm 112b, extends the upper electrode 122 with the same phase, and connects the upper electrode 122 with the connection line B122.

The extended line W124 is provided on the child arm 111b, extends the upper electrode 124 with the same phase, and connects the upper electrode 124 with the connection line B122.

The extended line W126 is provided on the child arm 112c, extends the upper electrode 126, and connects the upper electrode 126 with the connection line B122.

The configuration of the extended line W112 is similar to that of the first embodiment.

The other configuration and effect are similar to those according to the first embodiment.

Fifth Embodiment

Figure 8:
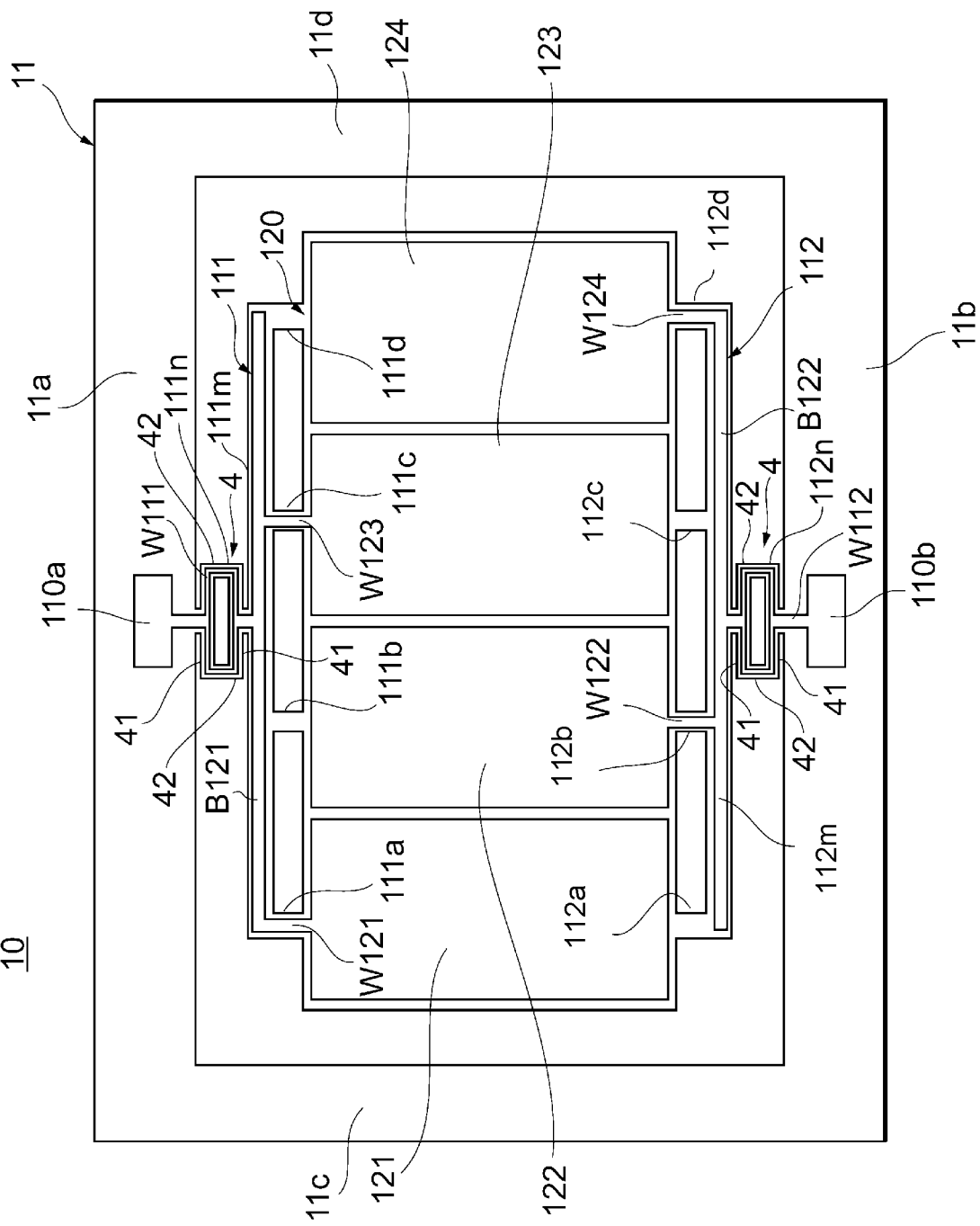
FIG. 8 is a plan view schematically illustrating an example structure of a resonator according to a fifth embodiment.

FIG. 8 is a plan view schematically illustrating an example structure of a resonator 10 according to this embodiment. The points different from the first embodiment are described below from among components of the resonator 10 according to this embodiment.

Vibrating Portion 120

The configuration of a vibrating portion 120 is similar to that according to the first embodiment.

Holder 11

The configuration of a holder 11 is similar to that according to the first embodiment.

Holding Units 111 and 112

Main arms 111n and 112n of holding units 111 and 112 according to this embodiment each have a vibration absorbing portion 4 protruding in a direction orthogonal to corresponding one of the main arms 111n and 112n. The vibration absorbing portion 4 is formed of two pairs of opposite arms 41 and opposite arms 42. The arms 41 extend in a direction substantially parallel to a long side of the vibrating portion 120. The arms 42 are provided in a direction substantially perpendicular to the arms 41, and both ends of the arms 42 are respectively connected to both ends of the arms 41.

In this embodiment, since the main arms 111n and 112n of the holding units 111 and 112 each have the vibration absorbing portion 4, the propagation of vibration to the holder 11 can be reduced, and the vibration with harmonic of contour vibration propagating from the vibrating portion 120 can be efficiently confined.

The other configurations of the holding units 111 and 112 are similar to those according to the first embodiment.

Connection Line B121

The configuration of a connection line B121 according to this embodiment is similar to that according to the first embodiment.

Extended Lines W111, W121, and W123

In this embodiment, an extended line W111 is formed along the two pairs of arms 41 and 42 so as to cover the surface of the vibration absorbing portion 4 at the main arm 111n. To be specific, the extended line W111 extends from the connection position with respect to the connection line B121 substantially perpendicularly to the connection line B121, is divided into two at the connection position between the arm 41 and the support arm 111m on the vibration absorbing portion 4, and extends along the arm 41. The divided two portions of the extended line W111 bend in a direction substantially perpendicular to the arm 41 at the connection positions (on the support arm 111m side) between the arm 41 and the arms 42, extend along the arms 42, bend again in a direction substantially perpendicular to the arms 42 at the connection positions (on the frame body 11a side) between the arms 42 and the arm 41, extend along the arm 41, and join to each other. The extended line W111 joined into one extends from the junction position in a direction perpendicular to the arms 41, and is connected to the voltage applying portion 110a.

The configurations of the extended lines W121 and W123 are similar to those of the first embodiment.

Connection Line B122

The configuration of a connection line B122 according to this embodiment is similar to that according to the first embodiment.

Extended Lines W112, W122, and W124

In this embodiment, an extended line W112 is formed along the two pairs of arms 41 and 42 so as to cover the surface of the vibration absorbing portion 4 at the main arm 112n. To be specific, the extended line W112 extends from the connection position with respect to the connection line B122 substantially perpendicularly to the connection line B122, is divided into two at the connection position between the arm 41 and the support arm 112m on the vibration absorbing portion 4, and extends along the arm 41. The divided two portions of the extended line W112 bend in a direction substantially perpendicular to the arm 41 at the connection positions (on the support arm 112m side) between the arm 41 and the arms 42, extend along the arms 42, bend again in a direction substantially perpendicular to the arms 42 at the connection positions (on the frame body 11b side) between the arms 42 and the arm 41, extend along the arm 41, and join to each other. The extended line W112 joined into one extends from the junction position in a direction perpendicular to the arms 41, and is connected to the voltage applying portion 110b.

The configurations of the extended lines W122 and W124 are similar to those of the first embodiment.

The other configuration and effect are similar to those according to the first embodiment.

Sixth Embodiment

Figure 9:
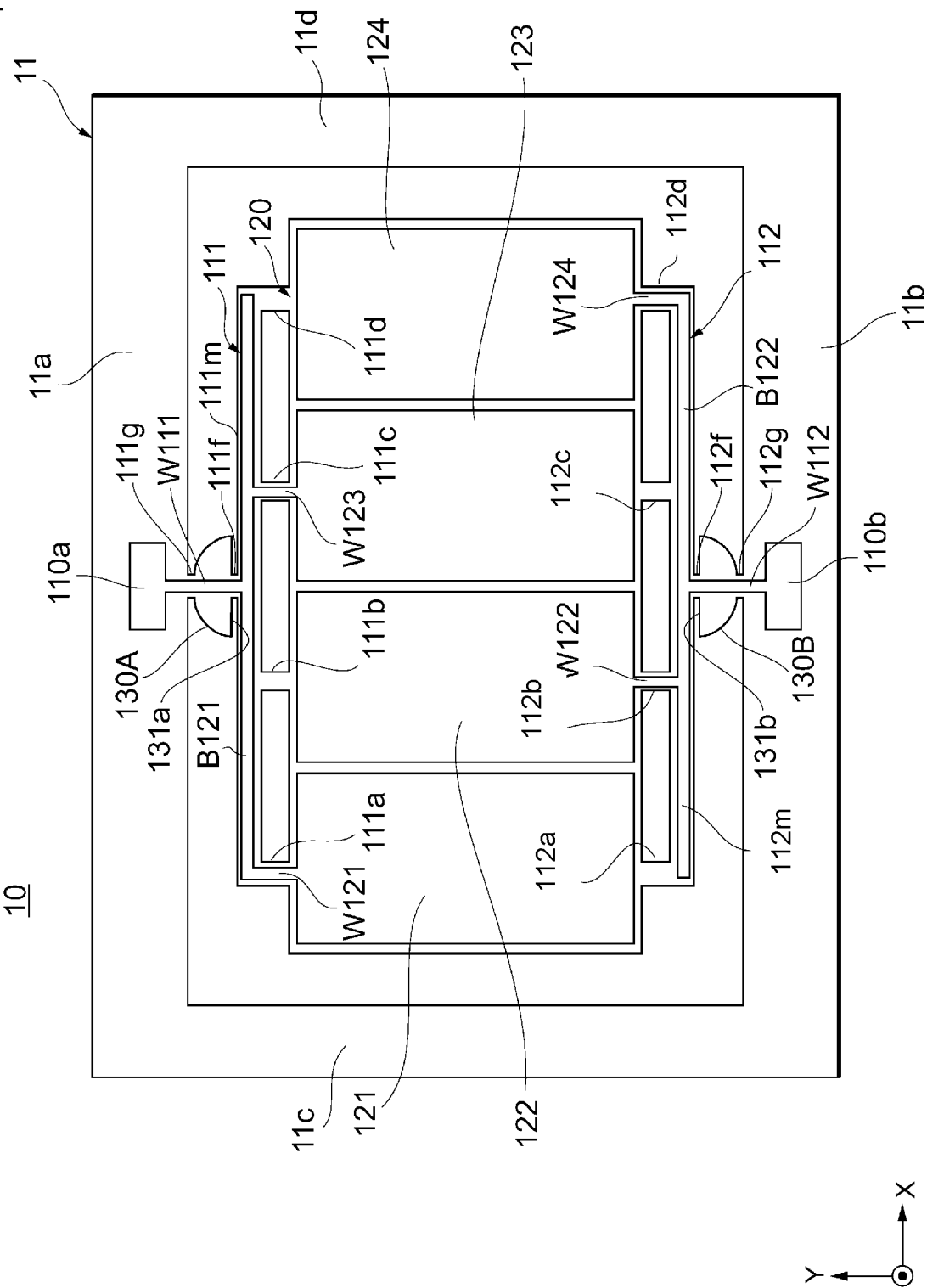
FIG. 9 is a plan view schematically illustrating an example structure of a resonator according to a sixth embodiment.

FIG. 9 is a plan view schematically illustrating an example structure of a resonator 10 according to this embodiment. The points different from the first embodiment are described below from among components of the resonator 10 according to this embodiment.

Vibrating Portion 120

The configuration of a vibrating portion 120 is similar to that according to the first embodiment.

Holder 11

The configuration of a holder 11 is similar to that according to the first embodiment.

Holding Unit 111

A holding unit 111 according to this embodiment includes a connection arm 111f, a holding arm 111g, and a node generating portion 130A, instead of the main arm 111n.

The node generating portion 130A is provided in a region between a long side of the vibrating portion 120 and the frame body 11a of the holder 11. The node generating portion 130A has a side 131a facing a long side of the support arm 111m. The side 131a of the node generating portion 130A is connected to the connection arm 111f. Also, the side 131a is provided at a constant gap with respect to the long side of the support arm 111m, substantially in parallel to the long side of the support arm 111m. The node generating portion 130A is connected to the support arm 111m by the connection arm 111f, and is connected to the holder 11 by the holding arm 111g.

The node generating portion 130A has a shape with a width in the X-axis direction decreases from the connection arm 111f toward the holding arm 111g. The node generating portion 130A also has a shape axially symmetrical about a perpendicular bisector of the side 131a. The node generating portion 130A has a portion with the maximum width in the X-axis direction on the connection arm 111f side with respect to the center in the Y-axis direction. In this embodiment, the width in the X-axis direction of the node generating portion 130A becomes the largest at the side 131a, gradually decreases from the connection arm 111f toward the holding arm 111g, and becomes the smallest at the connection position between the vertex of the node generating portion 130A and the holding arm 111g. The width in the X-axis direction of the node generating portion 130A does not have to continuously decrease, and, for example, may decrease stepwise or may partly have a large-width portion, as long as the width gradually decrease as a whole. Also, the peripheral edge of the node generating portion 130A may have projections and depressions without limited to a smooth shape.

In this embodiment, the node generating portion 130A has a semicircular shape having the side 131a as a diameter, and having a radius of about 30 μm. In this case, the center of a circle that forms an arc of the node generating portion 130A is located at the center of the side 131a. Alternatively, the center of the circle that forms the arc of the node generating portion 130A may be located at the center of the support arm 111m.

Also, the side 131a does not have to have the straight line, and may have an arcuate shape. In this case, the connection arm 111f is connected to the vertex of the side 131a. Further in this case, the center of the circle that forms the arc of the side 131a may be located on the connection arm 111f side or may be located on the holding arm 111g side. The length of the side 131a is preferably larger than the width in the X-axis direction of the connection arm 111f, and smaller than the long side of the vibrating portion 120.

The connection arm 111f has a substantially rectangular shape in this embodiment. A first end of the connection arm 111f is connected to a position around the center of the long side of the support arm 111m. The connection arm 111f extends from the connection position toward the node generating portion 130A substantially perpendicularly to the long side of the support arm 111m. A second end of the connection arm 111f is connected to the side 131a of the node generating portion 130A. In this embodiment, the width in the X-axis direction of the connection arm 111f is about 10 μm.

The holding arm 111g has a substantially rectangular shape. A first end of the holding arm 111g is connected to a portion with the smallest width in the X-axis direction of the node generating portion 130A. A second end of the holding arm 111g is connected to a region of the holder 11 facing the node generating portion 130A. The width in the X-axis direction of the holding arm 111g is preferably equal to or smaller than the width of the connection arm 111f. Since the width of the holding arm 111g is smaller than the width of the connection arm 111f, the propagation of vibration from the node generating portion 130A to the holder 11 can be reduced. In this embodiment, the width in the X-axis direction of the holding arm 111g is smaller than the width of the connection arm 111f, and is about 5 μm.

The node generating portion 130A of the holding unit 111 according to this embodiment has the structure with the width in the X-axis direction gradually decreases from the connection arm 111f toward the holding arm 111g. Hence, even if the propagating state of the vibration propagating from the vibrating portion 120 changes, a portion with a small displacement caused by the vibration is formed next to a portion with a large displacement caused by the vibration in the node generating portion 130A. Accordingly, the node generating portion 130A can form a node of the vibration on the node generating portion 130A by adjusting the displacement portion for the vibration leaking from the vibrating portion 120. The node generating portion 130A is connected to the holding arm 111g at this formed node, and hence the propagation of vibration from the vibrating portion 120 to the holder 11 can be reduced. As the result, anchor loss of the resonator 10 can be decreased, and Q-value can be improved.

The other configuration of the holding unit 111 is similar to that according to the first embodiment.

Holding Unit 112

A holding unit 112 according to this embodiment includes a connection arm 112f, a holding arm 112g, and a node generating portion 130B, instead of the main arm 112n. The configuration and function of the connection arm 112f are similar to the configuration and function of the connection arm 111f. The configuration and function of the holding arm 112g are similar to the configuration and function of the holding arm 111g. Further, the configuration and function of the node generating portion 130B are similar to the configuration and function of the node generating portion 130A.

Connection Line B121

The configuration of a connection line B121 according to this embodiment is similar to that according to the first embodiment.

Extended Lines W111, W121, and W123

In this embodiment, the extended line W111 is connected to a position around the center of the connection line B121, and is formed to extend from the connection arm 111f to the holding arm 111g along the perpendicular bisector at the side 131a of the node generating portion 130A. The configurations of the extended lines W121 and W123 are similar to those of the first embodiment.

Connection Line B122

The configuration of a connection line B122 according to this embodiment is similar to that according to the first embodiment.

Extended Lines W112, W122, and W124

In this embodiment, the extended line W112 is connected to a position around the center of the connection line B122, and is formed to extend from the connection arm 112f to the holding arm 112g along the perpendicular bisector at a side 131b of the node generating portion 130B. The configurations of the extended lines W122 and W124 are similar to those of the first embodiment.

The other configuration and effect are similar to those according to the first embodiment.

The above-described exemplary embodiments are provided for easier understanding of the present invention and are not for interpreting the present invention in a limited manner. It should be appreciated that the present embodiments may be modified and improved without departing from the idea, and the present invention includes the equivalents. That is, the present invention includes, within its scope, a configuration obtained by those skilled in the art properly adding a change in design to any of the aforementioned embodiments as long as the resultant has the characteristics of the present invention. For example, respective elements, their arrangement, materials, conditions, shapes, sizes, and so forth in any of the aforementioned embodiments are not limited to those exemplified, and may be properly changed. The embodiments are merely examples, and the respective elements included in different ones of the aforementioned embodiments may be combined as far as technically possible. The present invention includes the combination as long as the combination has the characteristics of the present invention.

REFERENCE SIGNS LIST 10 resonator
11 frame (i.e., holder)
11a to 11d frame body
110a and 110b voltage applying portion
111 holding unit
111a to 111e child arm
111m support arm
111n main arm
112 holding unit
112a to 112e child arm
112m support arm
112n main arm
120 vibrating portion
121 to 127 upper electrode
128 piezoelectric thin film
129 lower electrode
130 Si substrate
B121 and B122 connection line
b121 and b125 busbar
W111, W112, W121, W123, W122, and W124 extended line

The invention claimed is:

1. A resonator, comprising:
a rectangular vibrating portion having a pair of opposing first sides and a pair of opposing second sides, and configured to provide contour vibration;
a frame that surrounds a periphery of the vibrating portion;
a first holding unit disposed between the frame and one of the first sides, including a first arm extending in a direction substantially parallel to the one first side, a plurality of second arms connecting the first arm to the vibrating portion, and a third arm connecting the first arm to the frame;
a first and a second terminal disposed on the frame;
a first connection line disposed on the first arm and electrically connected to the first terminal;

at least three upper electrodes disposed on the vibrating portion;

a lower electrode disposed on the vibrating portion on a surface of the vibrating portion opposite the at least three upper electrodes; and a plurality of first extended lines disposed on respective second arms of the plurality of second arms and electrically connecting first and second upper electrodes of the at least three upper electrodes to the first connection line, such that the first and second upper electrodes receive an electric field with a phase applied from the first terminal, wherein a third upper electrode of the at least three upper electrodes is electrically connected to the second terminal, such that the third upper electrode receives an electric field having a different phase than the phase of the electric field applied to the first and second upper electrodes, and wherein the first holding unit comprises at least one hole defined therein between at least a portion of the third upper electrode and the first arm of the first holding unit including the first connection line.

2. The resonator according to claim 1, further comprising:

a second holding unit provided between the frame and a second of the first sides, including a fourth arm extending in a direction substantially parallel to the second of the first sides, a fifth arm connecting the fourth arm to the vibrating portion, and a sixth arm connecting the fourth arm to the frame;

a second connection line disposed on the fourth arm of the second holding unit and electrically connected to the second terminal; and a second extended line disposed on the fifth arm and electrically connecting the third upper electrode to the second connection line.

3. The resonator according to claim 2, wherein the resonator comprises at least four upper electrodes including the first, second and third upper electrodes, wherein the fifth arm includes a plurality of the fifth arms and the second extended line include a plurality of the second extended line electrically connected to the third and fourth upper electrodes, respectively, and wherein the third and fourth upper electrodes receive the electric field with the phase different from the phase of the electric field applied to the first and second electrodes.

4. The resonator according to claim 3, wherein the at least one hole defined in the first holding unit is also defined between at least a portion of the fourth upper electrode and the first arm of the first holding unit including the first connection line disposed thereon.

5. The resonator according to claim 2, wherein the second holding unit comprises at least one hole defined therein between at least a portion of one of the first and second upper electrodes and the fourth arm of the second holding unit including the second connection line.

6. The resonator according to claim 3, wherein two arms of the plurality of second arms of the first holding unit are positioned to correspond to the first and second upper electrodes, respectively, and wherein two arms of the plurality of fifth arms of the second holding unit are positioned to correspond to the third and fourth upper electrodes, respectively.

7. The resonator according to claim 1, wherein the at least three upper electrodes, the first and second terminals, the first connection line and the plurality of first extended lines are disposed in a same planar surface of the resonator.

8. The resonator according to claim 1, wherein the third upper electrode is disposed on the vibrating portion between the first and second upper electrodes.

9. The resonator according to claim 1, wherein the lower electrode is electrically insulated from both the first and second terminals.

10. The resonator according to claim 9, wherein the lower electrode is a float electrode.

11. A resonator, comprising:

a rectangular vibrating portion configured to provide contour vibration and having a pair of first sides being opposite to each other and a pair of second sides being opposite to each other;

a frame that surrounds a periphery of the vibrating portion to hold the vibrating portion;

a first holding unit disposed between the frame and one of the first sides, and having a plurality of connecting arms securing the vibrating portion to the frame;

a first terminal and a second terminal disposed on the frame and configured to provide first and second electric fields have different phases with respect to each other;

a first connection line extending in a direction parallel to the one first side and electrically connected to the first terminal to receive the first electric field;

at least three upper electrodes disposed on the vibrating portion;

a plurality of first extended lines disposed on the plurality of connecting arms of the first holding unit, and electrically connecting first and second upper electrodes of the at least upper three electrodes, respectively, to the first connection line, wherein a third upper electrode of the at least three upper electrodes is electrically connected to the second terminal, such that the third upper electrode receives the second electric field having a different phase than the first electric field applied to the first and second upper electrodes, and wherein the first holding unit comprises at least one hole defined therein between at least a portion of the third upper electrode and first connection line.

12. The resonator according to claim 11, further comprising:

a second holding unit disposed between the frame and a second of the pair of first sides, and having at least one connecting arm securing the vibrating portion to the frame;

a second connection line disposed on the frame and extending in a direction parallel to the second of the pair of first sides and electrically connected to the second terminal to receive the second electric field, and at least one second extended line disposed on the at least one connecting arm of the second holding unit, respectively, and connecting the third upper electrode to the second connection line.

13. The resonator according to claim 12, wherein the resonator comprises at least four upper electrodes including the first, second and third upper electrodes, wherein the at least one connecting arm of the second holding unit comprises a plurality of connecting arms and the at least one second extended line includes a plurality of second extended lines, wherein the plurality of second extended lines are electrically connected to the third and fourth upper electrodes, respectively, and wherein the third and fourth upper electrodes receive the electric field with the phase different from the phase of the electric field applied to the first and second electrodes.

14. The resonator according to claim 13, wherein the at least one hole defined in the first holding unit is also defined between at least a portion of the fourth upper electrode and the first connection line.

15. The resonator according to claim 12, wherein the second holding unit comprises at least one hole defined therein between at least a portion of one of the first and second upper electrode and the second connection line.

16. The resonator according to claim 13,
wherein two connecting arms of the plurality of connecting arms of the first holding unit are positioned to correspond to the first and second upper electrodes, respectively, and
wherein two arms of the plurality of connecting arms of the second holding unit are positioned to correspond to the third and fourth upper electrodes, respectively.

17. The resonator according to claim 11, wherein the at least three upper electrodes, the first and second terminals, the first connection line and the plurality of first extended lines are disposed in a same planer surface of the resonator.

18. The resonator according to claim 11,
wherein the first connection line is disposed on the frame and extends in the direction parallel to the one first side of the rectangular vibrating portion, and
wherein the plurality of first extended lines extend in a direction perpendicular to the direction of the first connection line to electrically connect the first and second upper electrodes to the first connection line.

19. The resonator according to claim 11, wherein the first connection line is disposed on the first holding unit frame and the plurality of first extended lines extend in a direction perpendicular to the direction of the first connection line to electrically connect the first and second upper electrodes to the first connection line.

20. A resonator, comprising:
a rectangular vibrating member configured to provide contour vibration and having a pair of first sides opposite to each other and a pair of second sides opposite to each other;
a frame surrounding the vibrating member to hold the vibrating member;
first and second terminals disposed on the frame and configured to provide first and second electric fields, respectively, that have different phases with respect to each other;
a pair of holding units disposed between the frame and respective first sides of the pair of first sides;
a plurality of electrodes disposed on a same surface the vibrating portion; and
a pair of connection lines respectively disposed on the pair of holding units, each connection line extending in a direction parallel to first sides of the vibrating member,
wherein each of the holding units comprises a plurality of connecting arms connecting the vibrating member to the frame,
wherein the pair of connection lines each electrically couple a different portion of the plurality of electrodes to the first and second terminals, respectively, and
wherein each of the holding units comprises at least one hole defined therein between at least one of the plurality of electrodes and the connection line respectively disposed on said holding unit.

* * * * *